United States Patent
Miske

(10) Patent No.: US 7,095,266 B2
(45) Date of Patent: Aug. 22, 2006

(54) CIRCUIT AND METHOD FOR LOWERING INSERTION LOSS AND INCREASING BANDWIDTH IN MOSFET SWITCHES

(75) Inventor: Myron J. Miske, Newfields, NH (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/920,882

(22) Filed: Aug. 18, 2004

(65) Prior Publication Data

US 2006/0038604 A1   Feb. 23, 2006

(51) Int. Cl.
*H03K 17/687*   (2006.01)
(52) U.S. Cl. .................................... 327/427
(58) Field of Classification Search ................ 327/389, 327/427, 431, 434, 534–535, 537, 543, 546, 327/437, 404, 379
See application file for complete search history.

(56) References Cited

U.S. PATENT DOCUMENTS

| | | | | |
|---|---|---|---|---|
| 5,689,209 A | * | 11/1997 | Williams et al. | 327/425 |
| 5,767,733 A | * | 6/1998 | Grugett | 327/534 |
| 5,818,099 A | | 10/1998 | Burghartz | |
| 6,194,952 B1 | * | 2/2001 | Shigehara | 327/534 |
| 6,281,737 B1 | * | 8/2001 | Kuang et al. | 327/382 |
| 6,335,653 B1 | * | 1/2002 | Shigehara et al. | 327/534 |
| 6,377,112 B1 | * | 4/2002 | Rozsypal | 327/534 |

* cited by examiner

*Primary Examiner*—My-Trang Nu Ton
(74) *Attorney, Agent, or Firm*—Cesari and McKenna, LLP; Edwin H. Paul, Esq.

(57) ABSTRACT

A DC symmetrical FET switch includes second and third switches connecting the well of the symmetrical FET switch to the drains and the source when the symmetrical FET switch is on. When the three FET's are on, the well, source and drain of the symmetric FET switch all exhibit the same input signal, wherein the drains and source to well capacitances are substantially prevented from draining off any of the input signal, thereby increasing the bandwidth and decreasing the insertion loss of the switch. The second and third switches are also FET switches. An enable signal is connected to the gates of all three FET's turning them on and off together. When the enable is false the FET switches are turned off and their wells are driven to a potential a proper potential. When the FET's are n-type the potential is low and when the FET's are p-types the potential is high. A resistor is provided in the gate drive of the first FET switch that further increases bandwidth and decreases insertion loss of the switch by moving the break frequency of the drain and source to gate capacitances.

12 Claims, 3 Drawing Sheets

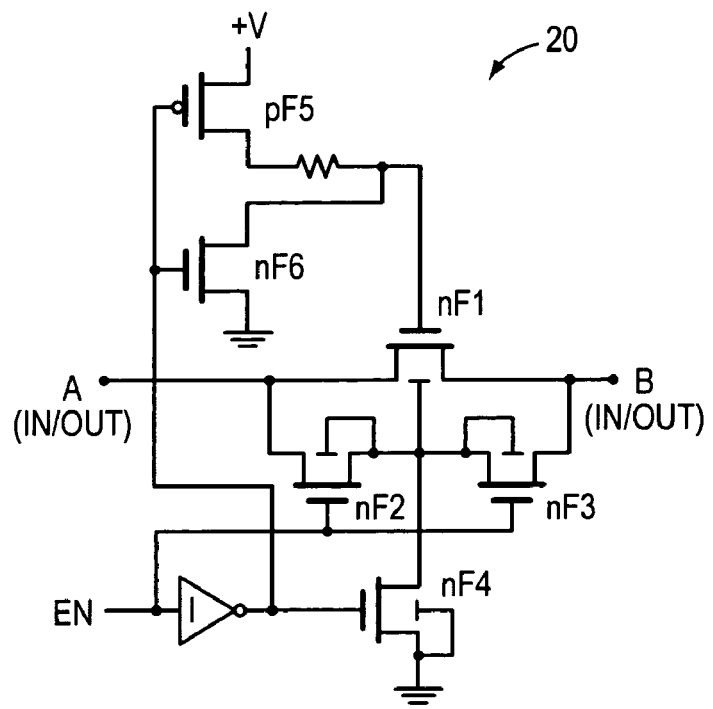
FIG. 5
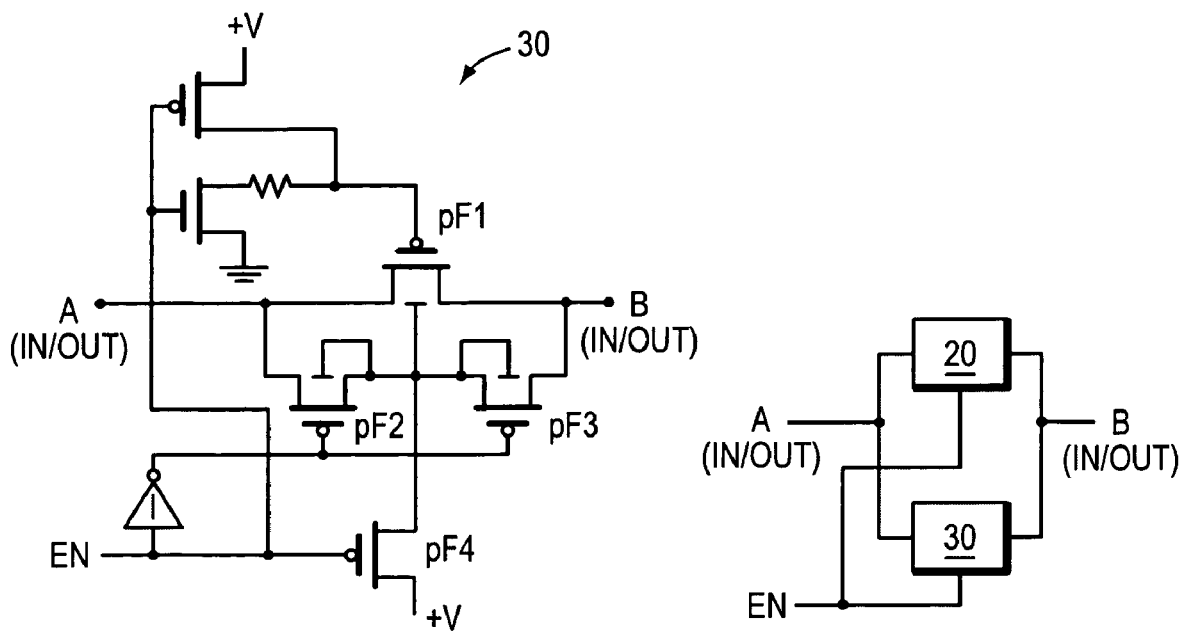
FIG. 6
FIG. 7

CIRCUIT AND METHOD FOR LOWERING INSERTION LOSS AND INCREASING BANDWIDTH IN MOSFET SWITCHES

BACKGROUND OF THE INVENTION

1. Field of the Invention

The present invention relates to MOSFET devices and more particularly to MOSFET devices used as low on-impedance switches.

2. Background Information

MOSFET switches are found in many applications and have become common in high frequency switch applications. Known designs have focused on lowering insertion loss and increasing the bandwidth by minimizing the "body effect," that is inherent in MOSFET structures. Insertion loss can be described, generally, as the loss of signal power delivered to a load due to the addition of a less than perfect switch compared to that if the switch were perfect.

The body effect becomes significant when the FET switch is turned on and neither the source nor the drain are at the same potential as the well. In such instances, the well acts like another gate (sometimes referred to as a "back gate") and produces a localized increase in the threshold voltage of the device which in turn reduces the conduction from source to drain. That is, the switch on-resistance increases which, in turn, reduces its bandwidth. Bandwidth is defined herein as the −3 dB point on the continuous curve of insertion loss versus frequency.

A representative prior art design focused on reducing the body effect is shown in FIG. 1. This FIG. 1 is found in U.S. Pat. No. 5,818,099 ('099) to Burghartz (as his FIG. 2) illustrating a basic SPST RF (single pole single throw radio frequency) switch. FET1 is the primary switch. A second FET3 shares common gate and source connections with the FET1. The EN signal high turns on both FET1 and FET3, where FET3 connects the well of FET1 to its source. As discussed above, this minimizes the body effect in the '099 switch by keeping the well and source at the same potential. However, note there is no corresponding FET across the drain to the well of FET1. The drain of FET1 may be at different potential due to any drop across FET1.

When EN is false, FET1 is off and its well is driven to ground via FET4. Its drain is driven to ground via FET2. These functions are meant to enhance the off impedance of FET1.

The different handling of the source and drain of FET1 renders FET1 as a one-way, nonsymmetrical switch that is suitable only for passing AC signals. The one-way is also evidenced by the labeling in the '099 of RF IN and RF OUT.

The '099 patent describes an n-type MOSFET structure with a p-well that is isolated from the p-type substrate using n-type well as shown in FIG. 6A of the '099 patent. This type of structure is now commonly used by many makers of such switches, and this same basic structure is used for n-type MOSFET structures in preferred embodiments of the present invention. The '099 patent is hereby incorporated herein by reference.

There are applications where a symmetrical MOSFET switch would be advantageous where signals traveling in either direction would encounter the same switch characteristics. It would also be advantageous to have a switch that may be DC or AC coupled with an improved bandwidth and lowered insertion loss.

SUMMARY OF THE INVENTION

In view of the foregoing background discussion, the present invention provides a symmetric DC coupled primary FET switch. The input signal may be connected to either the source or the drain of the FET switch with an output from the drain or the source, respectively. Two other FET switches are provided, one connects the well of the primary FET switch to its source and the second connects the well to its drain. The gates of the primary FET switch and the two other FET switches are driven in concert by an enable signal. All three are on or off together. The function of the two other FET switches drive the well of the primary FET with the same signal that appears at the input and the output. This action substantially reduces the loss of the input signal with frequency through the source-well (Csw) and the drain-well (Cdw) capacitors. The net effect is to reduce the insertion loss at higher frequencies and increase the bandwidth of the switch.

When the enable is false the primary FET switch and the other two FET switches are turned off, and a fourth FET switch is on connecting the well of the first three FET's to a suitable potential. The potential is low when the first three FET's are n-types and high when they are p-types. The operation of this fourth FET improves the off-isolation of the switch.

Input signal is lost via the source-gate (Csg) and the drain-gate (Cdg) capacitors to the gate of the primary FET switch. To reduce this loss a resistor is placed between the enable signal and the gate of the primary FET switch. The resistor increases the break frequency of this resistor/capacitor circuit. This reduces the insertion loss at higher frequencies and increases the bandwidth of the primary FET switch. The resistor may be bypassed to decrease the turn off time.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which:

FIG. 5 is a schematic of a completed switch circuit using n-type devices;

FIG. 6 is a p-type implementation of the inventive switch circuit; and

FIG. 7 is a schematic/block diagram showing an embodiment with parallel n-type and p-type switch circuits.

DETAILED DESCRIPTION OF AN ILLUSTRATIVE EMBODIMENT

Figure 1:
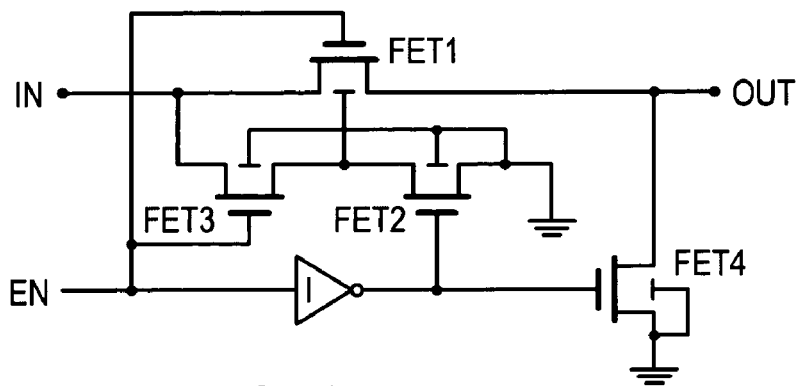
FIG. 1 is a prior art circuit schematic of a MOSFET switch as found in the '099 patent.
Figure 2A:
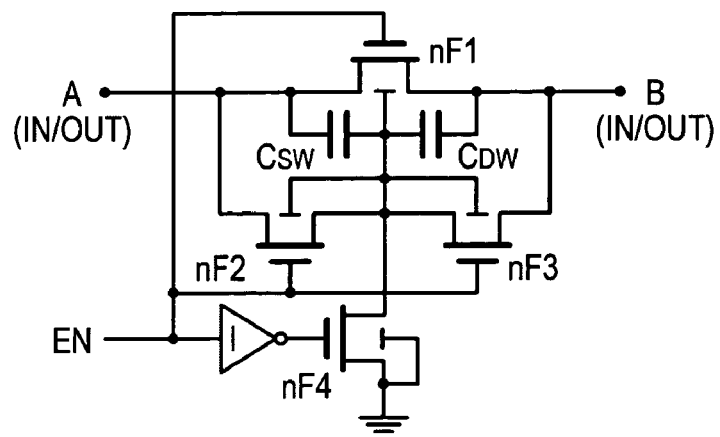
FIG. 2A is a schematic of an embodiment of the present invention using n-type devices.

FIG. 2A is an embodiment of the present invention where an input signal may be introduced at node A or B emerging at node B or A, respectively, when the switch nF1 is on. In this circuit there is an n-type MOSFET nF2 with common source, gate and well connections as with nF1. There is also an n-type MOSFET, nF3, with common drain, gate, and well connection as with nF1. The drain of nF2 is connected to the source of nF3 and the well of nF1. The n-type MOSFET's in the embodiments of the present invention are constructed with their p-wells isolated from the p-substrate, usually by an n-type well. This type of construction is well known in the art.

With n-type MOSFETs, EN high turns on nF1, nF2 and nF3. In practice nF2 and nF3 are made the same size, and thus the basic switch is bilateral offering the same impedance in either direction. When EN is low, the circuit also offers the same high impedance in either direction when nF1, nF2 and nF3 are all off, and nF4 is on driving the back gate of nF1 and the drains of nF2 and nF3 low.

Referring to FIG. 2A of the present invention, when nF1 is on its well is connected to both its source and drain via nF2 and nF3, respectively, thereby minimizing body effects by having the same signal appear at the well, source and drain of nF1. Typically nF2 and nF3 are made of equal size and characteristics, and therefore with any potential drop, Vds, across nF1, its well would be at ½ Vds. This maintains the symmetry of this preferred embodiment.

The symmetrical functions of nF2 and nF3, in FIG. 2A, illustrates a lowered insertion loss and higher bandwidth of the present invention. As discussed above, when nF1 is on, the signal appears at both the source and drain of nF1, assuming minimal drop across nF1. Some of that signal would be siphoned off through capacitors from both the source and the drain, Csw and Cdw, to the well of nF1, if the well were connected to ground, as is typical in the prior art with n-type FETs (and to +V with p-types). However, in the present invention, when nF2 and nF3 are on their low on resistances will tend to maintain a substantially constant voltage across both Csw and Cdw and thereby prevent signal siphoning through these capacitors and so decrease the insertion loss with frequency and increase the bandwidth of the switch while reducing insertion loss.

Figure 2B:
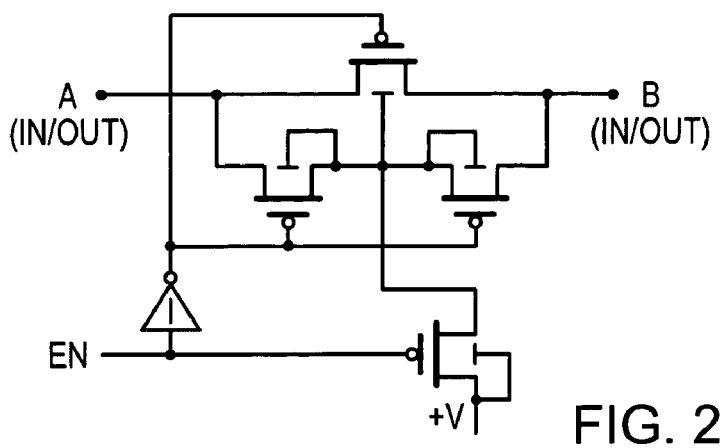
FIG. 2B is a schematic of a embodiment of the present invention using p-type devices.

FIG. 2B is a schematic that corresponds to that in FIG. 2A, but with all the n-type transistors replaced with p-types and the ground replaced by +V.

Figure 3:
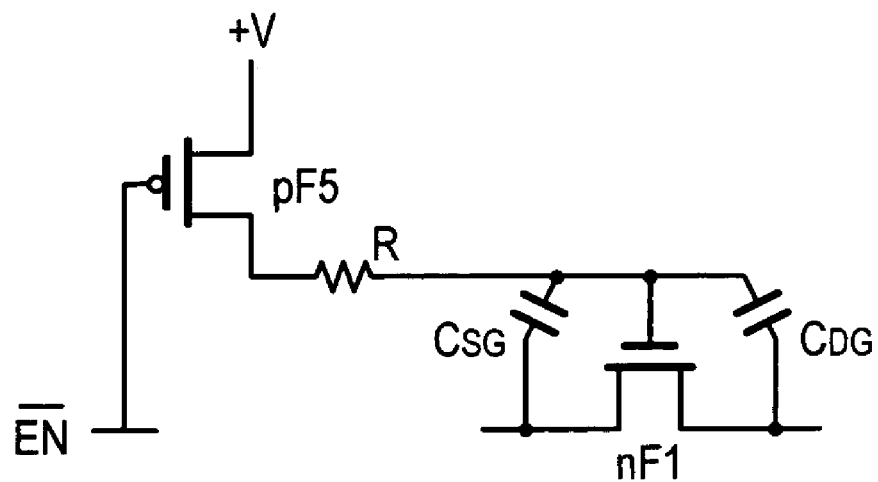
FIG. 3 is a schematic of a gate drive circuit.
Figure 4:
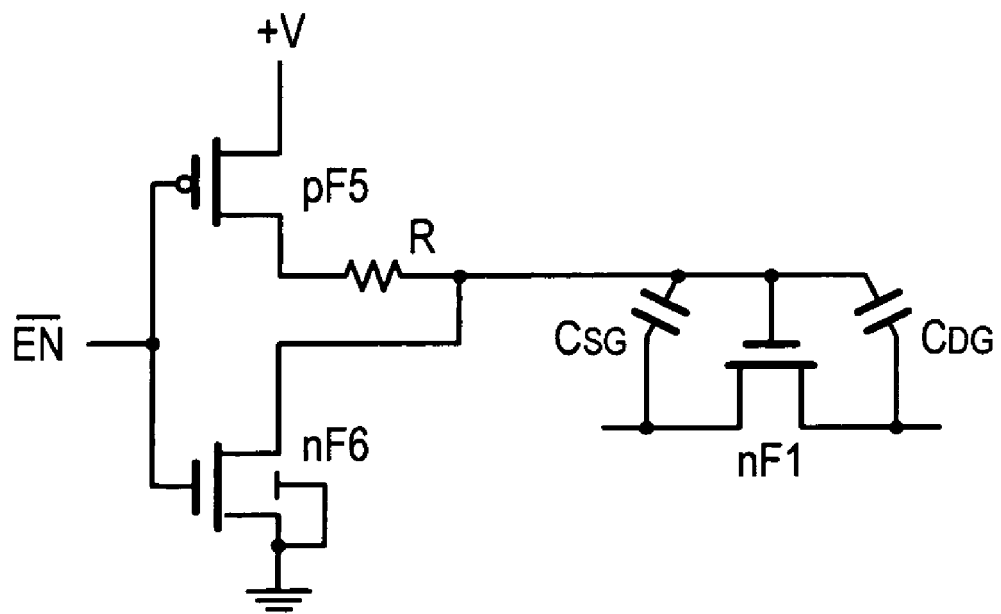
FIG. 4 is a schematic that completes the schematic of FIG. 3.

FIG. 3 shows another bandwidth improvement by including a series resistance R in the gate circuit of nF1. The break frequency roll off from the source and the drain to gate capacitances, Csg and Cdg, respectively, of nF1 is pushed to a higher frequency by the addition of the series resistance. FIG. 4 shows a drive transistor nF6 that bypasses the resistor R for a fast turn off nF1.

FIG. 5 shows a complete circuit using n-type transistors and FIG. 6 shows a corresponding circuit with p-types.

In practical applications there is a tradeoff between smaller switch structures, with smaller capacitances that increase bandwidth, but higher on impedances that reduce bandwidth. The present invention, with improved bandwidth, moves this tradeoff off to a higher frequency. In simulated circuits, an inventive n-type MOSFET switch with a nominal on resistance of four ohms has a bandwidth of 1.6 GHz compared to 350 MHz for a prior art design. A resistor, as known in the art, may be implemented by an on FET.

In another preferred embodiment, shown in FIG. 7, a p-type embodiment 30 of FIG. 6, and an n-type embodiment 20 of FIG. 5, may be constructed in parallel with each other with a simulated bandwidth of 0.9 GHz as compared to about 150 MHz for a prior art design. Since the actual levels of the signals may approach the pinch off of the transistors involved, a parallel arrangement of the p-type switch and the n-type switch will provide a switch with a wider range of voltage levels than either the n-type or p-type would have individually.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A symmetric DC switch comprising:
    a first field effect transistor (FET) having gate, source, drain and well contacts, wherein the source or the drain contact receives an input signal, an output signal substantially equal to the input signal is presented to the respective drain or source contact when the FET is on,
    a second FET arranged, when on, to connect the source to the well of the first FET,
    a third FET arranged, when on, to connect the drain to the well of the first FET, wherein the first second and third FET's are all on and off together, wherein the input signal appears at the source, drain and well of the first FET when the FET's are on, and
    a switch arranged between the well of the first FET and a potential, wherein the well is connected to the potential when the first FET is off, and
    a resistor arranged between an enable signal and the gate of the first FET, the enable signal, when true, turning on the first, second and third FET's and, when false, turning them off, wherein the bandwidth of the first FET, when on, is increased and the insertion loss reduced.

2. The switch of claim 1 further comprising switching circuitry connected directly to the gate of the first FET, wherein when the enable signal is false, the switching circuitry drives the gate directly, bypassing the resistor, providing faster turn off of the first FET.

3. The switch of claim 2, wherein the switching circuitry comprises fourth FET switch having a gate that received the enable signal, the fourth FET having a source and drain connected to provide a path between the gate of the first FET and a first potential that turns off the first FET, when the fourth FET is on.

4. The switch of claim 3 further comprising a fifth FET arranged to receive the enable signal at its gate, the fifth FET having a source and drain connected to provide a path between the resistor and a second potential that turns on the first FET when the enable is true.

5. A symmetric DC coupled switch comprising:
    a first FET having an input for receiving a signal and an output wherein the signal is provided when the switch is on, the first FET having a gate and a well,
    a second FET arranged when on for connecting the well to the input,
    a third FET arranged when on for connecting the well to the output, wherein the gates of the first, second and third FET's all receive an enable signal and are all on when the enable is true and are all off when the enable is false, and a fourth FET arranged when on for connecting the well of the first FET to a potential, the fourth FET is turned on by the enable being false, and a resistor arranged between an enable signal and the gate of the first FET, the enable signal, when true, turning on the first, second and third FET's and, when false, turning them off, wherein the bandwidth of the first FET, when on, is increased and the insertion loss reduced.

6. The switch of claim 5 wherein the FET's are all n-type.

7. The switch of claim 5 wherein the FET's are all p-types.

8. The symmetric DC coupled switch of claim 7 further comprising:

a first n-type FET having an input for receiving a signal and an output wherein the signal is provided when the switch is one, the first n-type FET having a gate and a well, a second n-type FET arranged when on for connecting the well to the input, a third n-type FET arranged when on for connecting the well to the output, wherein the gates of the first, second and third n-type FET's all receive an enable signal and are all on when the enable is true and are all off when the enable is false, and a fourth n-type FET arranged when on for connecting the well of the first n-type FET to a potential, the fourth n-type FET is turned on by the enable being false.

9. A method for decreasing insertion loss and increasing bandwidth of a symmetric DC switch, the method comprising the steps of:

providing a first FET having an input for receiving a signal, and an output, gate and well;

connecting an enable signal to the gate, wherein the enable when true turns the first FET on, delivering the signal to the output when the first FET is on, connecting the well to the input and the well to the output when the first FET is on, connecting the well to a potential when the first FET is off, and arranging a resistor between the enable signal and the gate of the first FET, wherein the bandwidth of the first FET, when on, is increased and the insertion loss is reduced.

10. The method of claim 9 further comprising the step of:

connecting switching circuitry between the enable signal and the gate of the first FET, wherein when the enable signal is false, the switching circuitry drives the gate directly, bypassing the resistor, turning off the first FET.

11. The method of claim 10 further comprising the step of connecting the gate of the first FET to a first potential that turns off the first FET when the enable is false.

12. The method of claim 11 further comprising the step of: providing a path between the resistor and a second potential that turns on the first FET when the enable is true.

* * * * *